United States Patent
Karaoguz et al.

(10) Patent No.: US 8,750,392 B2
(45) Date of Patent: Jun. 10, 2014

(54) PLC DEVICE SUPPORTING MIMO OPERATIONS

(75) Inventors: Jeyhan Karaoguz, Irvine, CA (US); James D. Bennett, Hroznetin (CZ)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/434,908

(22) Filed: Mar. 30, 2012

(65) Prior Publication Data
US 2013/0003877 A1 Jan. 3, 2013

Related U.S. Application Data

(60) Provisional application No. 61/503,060, filed on Jun. 30, 2011.

(51) Int. Cl.
*H04B 3/00* (2006.01)
(52) U.S. Cl.
USPC ............... 375/257; 340/12.32; 340/13.23; 340/538; 455/402
(58) Field of Classification Search
None
See application file for complete search history.

(56) References Cited

U.S. PATENT DOCUMENTS

| | | | |
|---|---|---|---|
| 7,269,403 B1 | 9/2007 | Miao | |
| 2005/0068223 A1* | 3/2005 | Vavik | 342/51 |
| 2008/0273613 A1 | 11/2008 | Kol | |
| 2010/0061433 A1 | 3/2010 | Stadelmeier et al. | |
| 2011/0286152 A1* | 11/2011 | Wolinsky et al. | 361/601 |
| 2013/0039362 A1* | 2/2013 | Emmanuel | 370/352 |

* cited by examiner

*Primary Examiner* — Adolf Dsouza
(74) *Attorney, Agent, or Firm* — Garlick & Markison; Bruce E. Garlick

(57) ABSTRACT

A communications device includes a PLC interface operable to couple at least two differing communication signals to at least two differing pairs of at least three conductors of a powerline medium. A processing module of the device and the PLC interface interact with a remote PLC device to determine connectivity of the remote PLC device to the PLC device via the at least three conductors of the powerline medium, select at least two conductor pairs of the powerline medium that communicatively couple the PLC device to the remote PLC device for Multiple Input Multiple Output (MIMO) signal servicing, and simultaneously transmit MIMO PLC signals to the remote PLC device via the at least two conductor pairs. The communications device may also include a non-PLC interface, with the communications device operable to divide MIMO communications between a powerline medium and a non-PLC medium, e.g., coaxial cable, cat-5 cable.

20 Claims, 10 Drawing Sheets

PLC DEVICE SUPPORTING MIMO OPERATIONS

CROSS-REFERENCE TO PRIORITY APPLICATION

This application claims priority under 35 U.S.C. §119(e) to U.S. Provisional Application Ser. No. 61/503,060 filed Jun. 30, 2011, which is incorporated herein by reference in its entirety.

BACKGROUND

1. Field of the Invention

The teachings herein relate to wired communications and in particular, devices that support powerline communications and other wired communications and systems of use therefore.

2. Description of the Related Art

With the growing need for the exchange of digital content (e.g. MP3 audio, MPEG4 video and digital photographs) there is a widely recognized need to improve digital communication systems. Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

Communications within a household or within other premises may also be serviced by a Wireless Local Area Network (WLAN), a cellular network, millimeter wave communications, e.g., 60 GHz, Wireless Personal Area Network (WPAN), Cable Modem Network, Local Area Network (LAN), and other communication techniques. Each of these communication types has its respective benefits and shortcomings. None of these communication types is typically able to provide a full coverage solution within the household (or other premises). The shortcoming of all wired technologies is the lack of mobility thereof. Shortcomings of all wireless technologies are coverage holes, which are typical, interference from other wireless devices, including competing wireless devices, Radar, etc., and bandwidth limitations.

DETAILED DESCRIPTION

Figure 1:
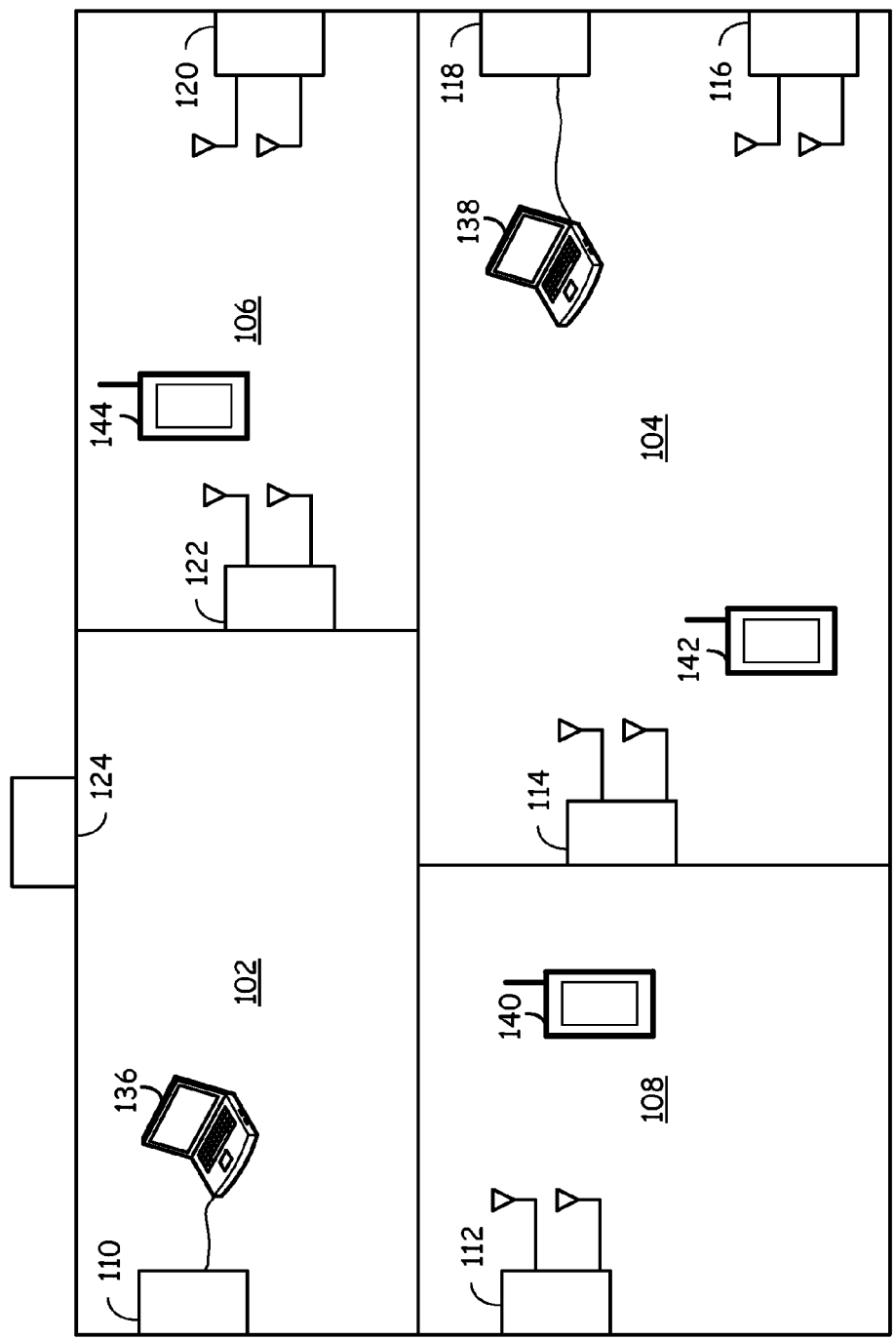
FIG. 1 is a system diagram illustrating a premises in which at least one Powerline Communication (PLC) device resides that operates according to one or more embodiments of the present invention.

FIG. 1 is a system diagram illustrating a premises in which at least one Powerline Communication (PLC) device resides that operates according to one or more embodiments of the present invention. The premises 100 has a distributed mains wiring system (not shown) consisting of one or more ring mains, several stubs and some distribution back to a junction box, referred to jointly as power line media, power mains, or otherwise. In other constructs the distributed mains wiring system has a breaker box with circuits routed there from in a star configuration. For the sake of example, the premises 100 has four areas 102, 104, 106, and 108, e.g., rooms. Each room 102, 104, 106, and 108 may have a different number of outlets and other power mains connections. Accordingly, there are a variety of distances and paths between different power outlets in the household 100. In particular, the outlets most closely located to each other are those on multi-plug strips, and the outlets furthest away from each other are those on the ends of stubs of different ring mains (e.g. power outlets in the garden shed and the attic). The majority of outlets associated with a particular application (e.g. Home Cinema) are normally located relatively close together.

Installed within the premises 100 are a plurality of PLC devices 110, 112, 114, 116, 118, 120, and 122. Also installed in the premises is a PLC device serving as a Gateway 124 for communications services. Each of the PLC devices 110-122 illustrated has a structure same or similar to the structure described with reference to FIGS. 2, 3, and/or FIG. 5 and that operates according to the operations described with reference to FIGS. 4, and 6-9. One or more of these PLC devices 110-122 may be a power adapter PLC IF that services a coupled mobile communication device, e.g., laptop computer 136 or 138 and/or mobile handset 140 or 142, which may be telephones, tablet computers, or other portable electronic devices.

The PLC devices 110-124 within the premises 100 communicate with one another according to one or more PLC communication standards, as may be modified herein according to the teachings described. All PLC communications among these devices are serviced via the PLC media of the power main(s). This PLC media includes at least two wires but more typically includes at least three or four wires, e.g., live, neutral, earth and ground for a four wire power mains. Thus, communication paths among the PLC devices 110-124 via the power mains may include four distinct conductors. Of these four distinct conductors, the communication paths may include up to six (6) distinct two-wire connections, as will be described further with reference to FIG. 3. The PLC devices 110-124 may also be coupled via other conductors as well, such as coaxial cabling, Cat-5 wiring, or other conductors. Thus, the PLC devices 110-124 may have the opportunity to communicate with one another other than via the powerline media using PLC communications.

According to the disclosure herein, the PLC devices 110-124 establish Multiple-Input-Multiple-Output (MIMO) communication links with one another over the powerline media (and/or other wired media). In such case, the PLC devices 110-124 determine at least two, two-wire communication paths to service the MIMO communications. In some embodiments, these multiple two-wire communication paths are solely power line media conductors. In other embodiments, the multiple two-wire communication paths include both powerline media conductors and other conductors, e.g., cable media, Cat-5 media, etc. In both cases, a first PLC device determines connectivity with a second PLC device via the PLC media or a combination of the PLC media and a non-PLC media. Then, the first PLC device determines channel quality for a plurality of wire pairs that connect the first PLC device with the second PLC device. The first PLC device and the second PLC device then establish MIMO communications there between via multiple wire pairs, two or more of which may share a common signal path. The MIMO communications may be symmetrical or asymmetrical.

Figure 2:
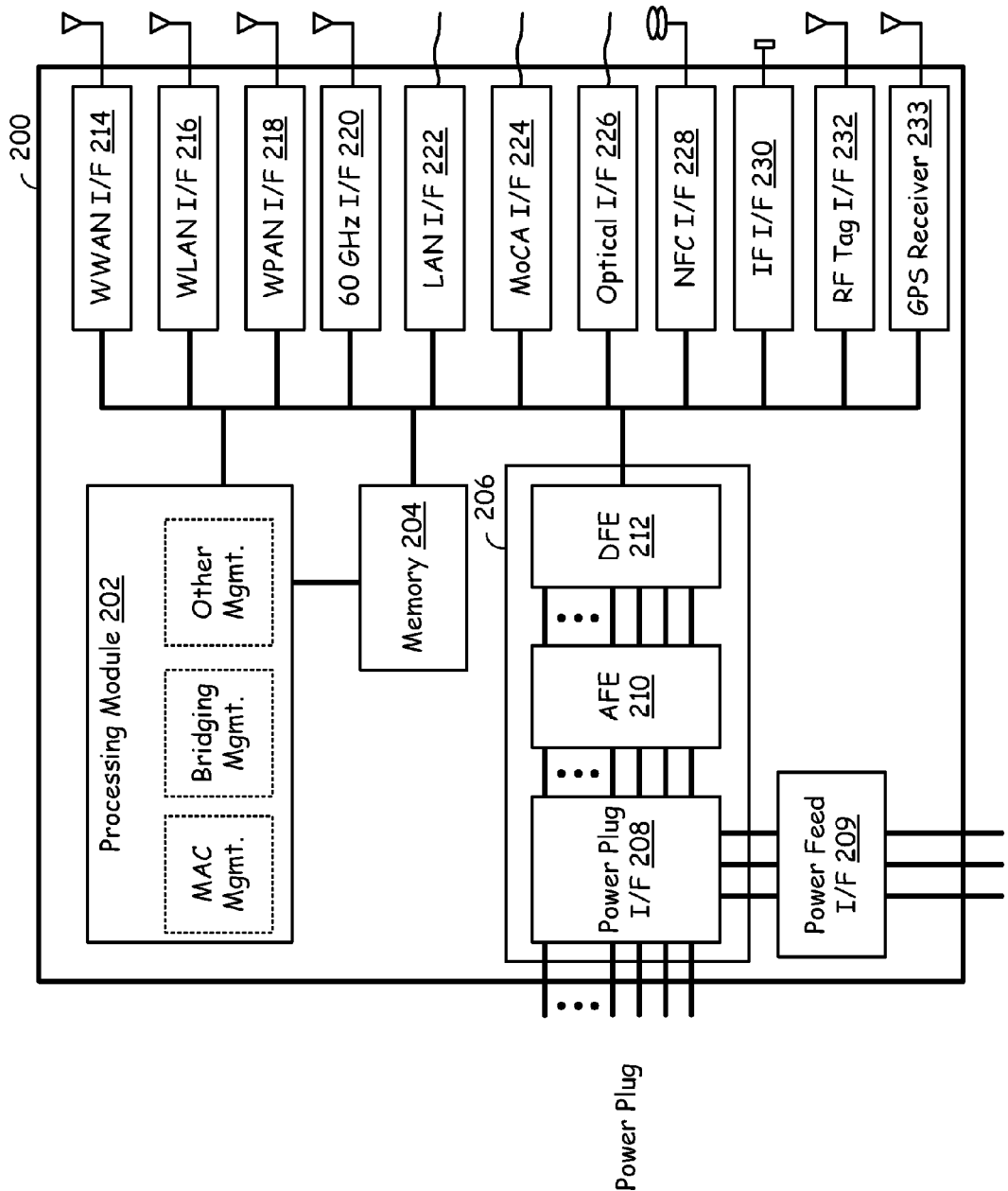
FIG. 2 is a block diagram illustrating a PLC device constructed according to one or more embodiments of the present invention.

FIG. 2 is a block diagram illustrating a PLC device constructed according to one or more embodiments of the present invention. The PLC device 200 supports PLC operations according to one or more PLC communication standards. The PLC device 200 may be coupled to a power plug, e.g., into a wall plug. The PLC device 200 may further include a power feed I/F 209 to provide switchable power to a coupled load device, e.g., device. In some embodiments, the PLC device 200 may be permanently installed within a home or other premises.

The PLC device 200 includes a PLC interface 206 that includes a power plug interface 208, an Analog Front End (AFE) 210, and a Digital Front End (DFE) 212. Generally the AFE 210 includes analog signal processing elements while the DFE 212 includes digital signal processing elements. At least one Analog to Digital Converter (ADC) and at least one Digital to Analog Converter (DAC) service analog to digital and digital to analog signal conversion operations, respectively. Various components of the PLC interface 206 as they relate to embodiments of the present invention will be described further herein.

The PLC device 200 also includes one or more other communication interfaces, including a Wireless Wide Area Network (WWAN) interface 214, e.g., a WiMAX interface, a Wireless Local Area Network (WLAN) interface 216, e.g., an 802.11x interface, a Wireless Personal Area Network (WPAN) interface 218, e.g., a Bluetooth interface, a 60 GHz interface 220 (millimeter wave interface), a Local Area Network (LAN) interface 222, e.g., an Ethernet interface, a cable interface, e.g. Multimedia over Coax Alliance (MoCA) interface 224, an optical interface 226, a Near Field Communication (NFC) I/F 228, an Infra-Red I/F 230, and/or an RF Tag I/F 232. The user should appreciate that the PLC device 200 may bridge communications between a power plug and one or more devices, e.g., between the power plug and a desktop computer, a laptop computer, a touchpad computer, an device, a television, another entertainment system device, etc., via the PLC interface 206 and one or more of the other communication interfaces 214, 216, 218, 220, 222, 224, 226, 228, 230, and/or 232.

The processing module 202 may include one or more of a system processor, a digital signal processor, a processing module, dedicated hardware, an application specific integrated circuit (ASIC), or other circuitry that is capable of executing software instructions and for processing data. In particular, the processing module 202 is operable to support Medium Access Control (MAC) management, communications bridging management, and other management of the communications circuitry of the PLC device 200. The memory 204 may be RAM, ROM, FLASH RAM, FLASH ROM, optical memory, magnetic memory, or other types of memory that is capable of storing data and/or instructions and allowing processing circuitry to access same. The processing module 202 and the memory 204 supports operations of embodiments of the present invention as further described herein. These operations may be embodied in software instructions stored in the memory 204 and executed by the processing module 202. The PLC device 200 of FIG. 2 supports the operations previously described with reference to FIG. 1 and that will be described further with reference to FIGS. 3-9.

According to an aspect of the present invention, the PLC interface 206 is operable to couple at least two differing MIMO communication signals to at least two differing pairs of at least three conductors of a powerline medium. In such case the processing module 202 and the PLC interface 206 are operable to interact with a remote PLC device to determine connectivity of the remote PLC device to the PLC device via the at least three conductors of the powerline medium. Based upon the connectivity, the processing module 202 and the PLC interface 206 are operable to select at least two conductor pairs of the powerline medium that communicatively couple the PLC device to the remote PLC device for MIMO signal servicing and to simultaneously transmit MIMO PLC signals to the remote PLC device via the at least two conductor pairs. With these operations, a conductor pair of the at least two conductor pairs may share a conductor of the powerline medium. The PLC device 200 may support 2×2, 3×3, or higher MIMO operations in a symmetrical or asymmetrical fashion. In establishing such operations, the PLC device 200 may determine channel quality available on each available conductor pair and select conductor pairs based upon such available channel quality, as will be described further herein.

Figure 3:
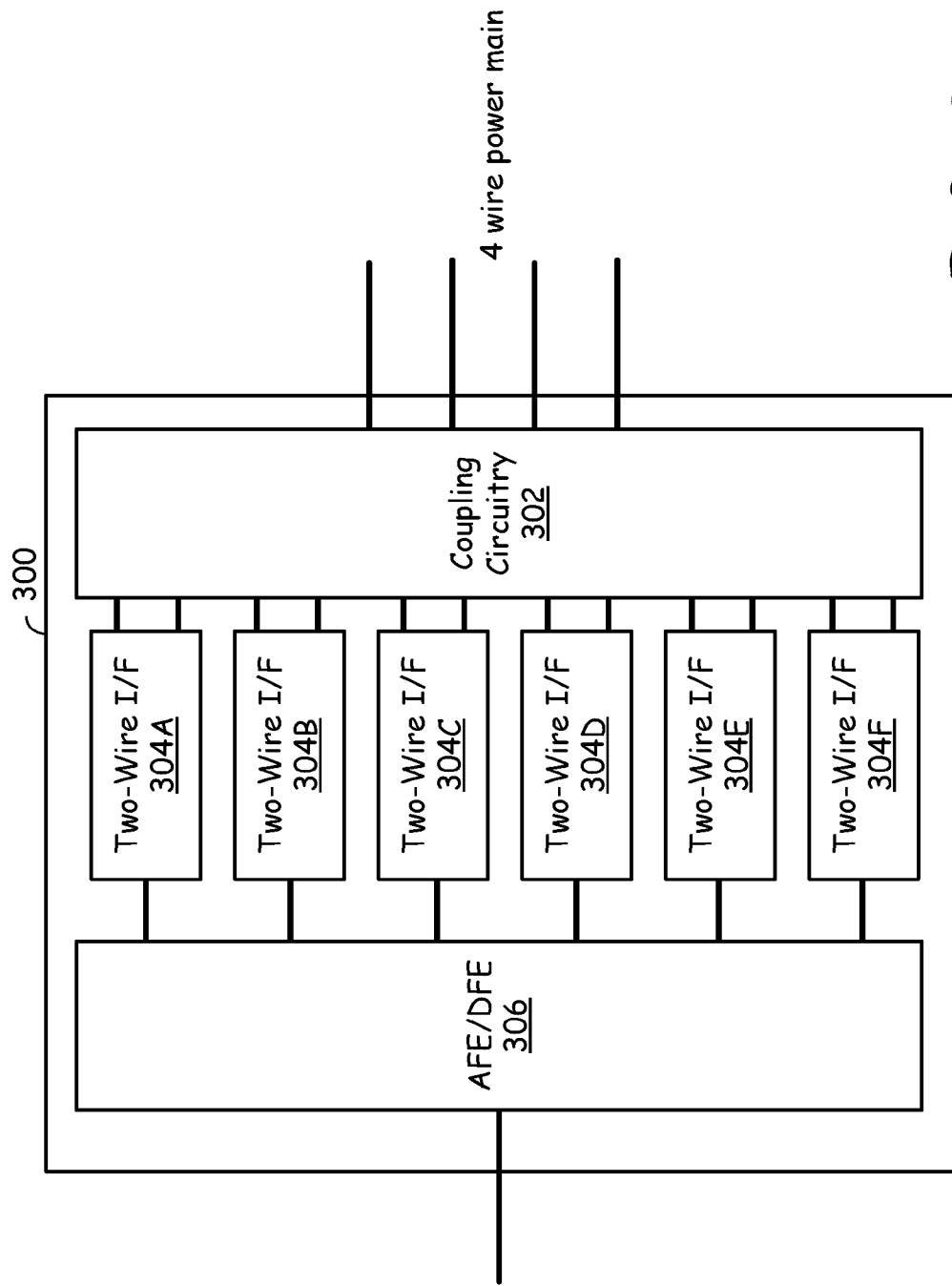
FIG. 3 is a block diagram illustrating a PLC interface according to an embodiment of the PLC device of FIG. 2.

FIG. 3 is a block diagram illustrating a PLC interface according to an embodiment of the PLC device of FIG. 2. The PLC interface 300 includes an AFE/DFE 306, a plurality of two wire interfaces 304A-304F and coupling circuitry 302, which couples the PLC interface 300 to a four wire power main. Each of the two-wire interfaces 304A-304F services a respective MIMO PLC signal and the coupling circuitry 302 couples MIMO signals produced by the two-wire interfaces to respective conductor pairs of the powerline medium to support at least 2×2 MIMO. In another embodiment, the PLC interface supports at least 3×3 MIMO. With the embodiment of FIG. 3, the AFE/DFE 306 may include a plurality of signal paths, each respective to a MIMO signal component.

Figure 4:
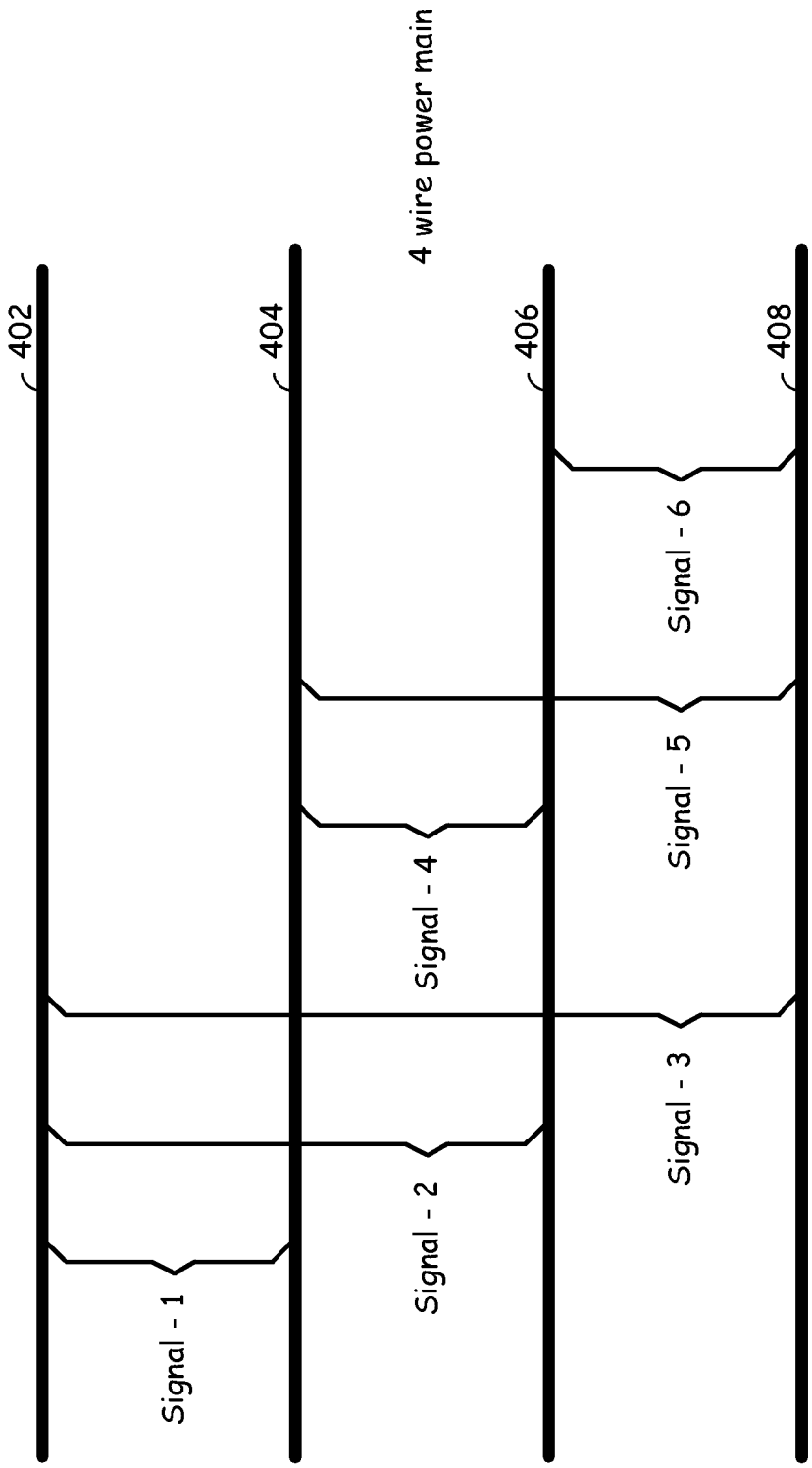
FIG. 4 is a diagram illustrating PLC signal coupling across various conductor pairs of a four wire power main according to one or more aspects of the present invention.

FIG. 4 is a diagram illustrating PLC signal coupling across various conductor pairs of a four wire power main. As illustrated in FIG. 4, the four wire power main includes four differing conductors 402, 404, 406, and 408. As is also illustrated, six differing unique signals may be coupled across unique conductor pairs of these four wires 402, 404, 406, and 408. Considering any two (or more) conductor pairs that support the at least two MIMO signals, two of the conductor pairs may share a signal return/path. Thus, according to the present invention, the MIMO signals that share a signal return path are potentially conflicting in frequency. Thus, in order to overcome such potential conflict, the MIMO signals are processed using spatial diversity techniques analogous to wireless MIMO processing to cause the differing MIMO signals to be correctly processed such that data throughput may be increased as compared to non-MIMO operations.

Figure 5:
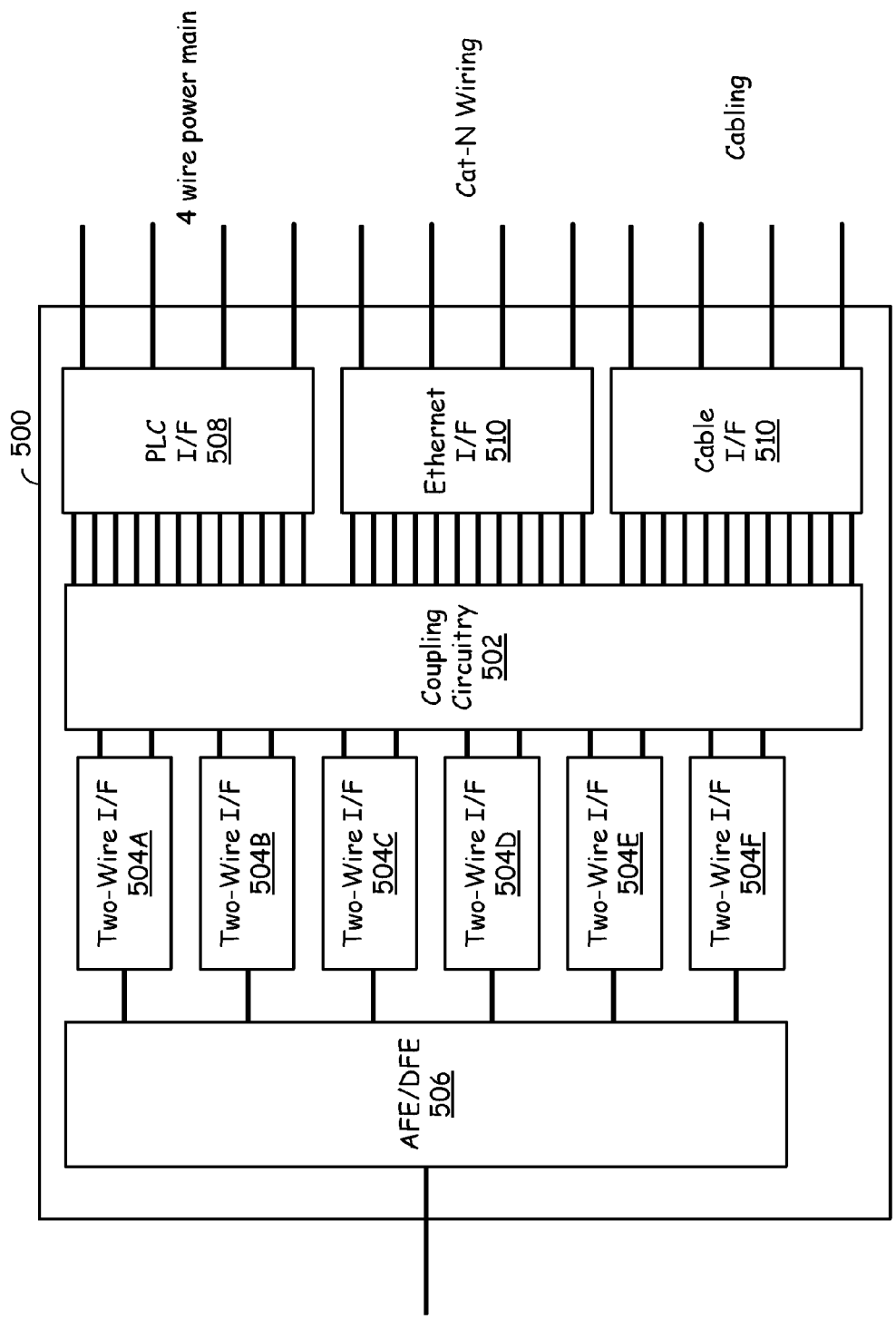
FIG. 5 is a block diagram illustrating a combined PLC interface/non-PLC interface that couples signals across multiple wired communication paths according to one or more aspects of the present invention.

FIG. 5 is a block diagram illustrating a combined PLC interface/non-PLC interface that couples signals across multiple wired communication paths. The interface of FIG. 5 may be combined elements of the PLC device 200 of FIG. 2 or may be a differing communication device. The interface 500 includes an AFE/DFE 506, a plurality of two wire interfaces 504A-504F, coupling circuitry 502, and a plurality of coupling interfaces, which include PLC I/F 508, Ethernet I/F 510, and cable I/F 510. These non-PLC I/Fs may be same/similar to the like named interfaces of the PLC device 200 of FIG. 2. The PLC I/F 508 couples the interface 500 to a power main, the Ethernet I/F couples the interface 500 to Cat-N (or other) wiring, and the cable I/F couples the interface 500 to cabling.

Each of the two-wire interfaces 504A-504F services a respective MIMO PLC signal and the coupling circuitry 502 couples MIMO signals produced by the two-wire interfaces to respective media to support at least 2×2 MIMO. In another embodiment, the PLC interface supports at least 3×3 MIMO. With the embodiment of FIG. 5, the AFE/DFE 506 may include a plurality of signal paths, each respective to a MIMO signal component.

A communication device that includes the interface 500 of FIG. 5 may include same or similar components as the PLC device 200 of FIG. 2. In its operations, the communication device, using the interface 500 interacts with a remote communications device to determine connectivity of the remote communications device to the communications device via the powerline medium and the non-PLC wired medium. Then, the communications device selects at least two conductor pairs of the powerline medium and the non-PLC wired medium that communicatively couple the communications device to the remote communications device for Multiple Input Multiple Output (MIMO) signal servicing. Then, the communications device simultaneously transmits MIMO signals to the remote communications device via the at least two conductor pairs.

In such operations, a first conductor pair that supports the MIMO signaling may be a conductor pair of the powerline medium and a second conductor pair may be a conductor pair of the non-PLC wired medium. In other operations, a first conductor of a second conductor pair is a conductor of the non-PLC wired medium and a shared third conductor of the first conductor pair and of the second conductor pair comprises a conductor of the powerline medium. Further, in other operations a first conductor of a first conductor pair is a conductor of the powerline medium, a first conductor of a second conductor pair comprises a conductor of the non-PLC wired medium, and a shared third conductor of the first conductor pair and of the second conductor pair comprises a conductor of the non-PLC wired medium.

Figure 6:
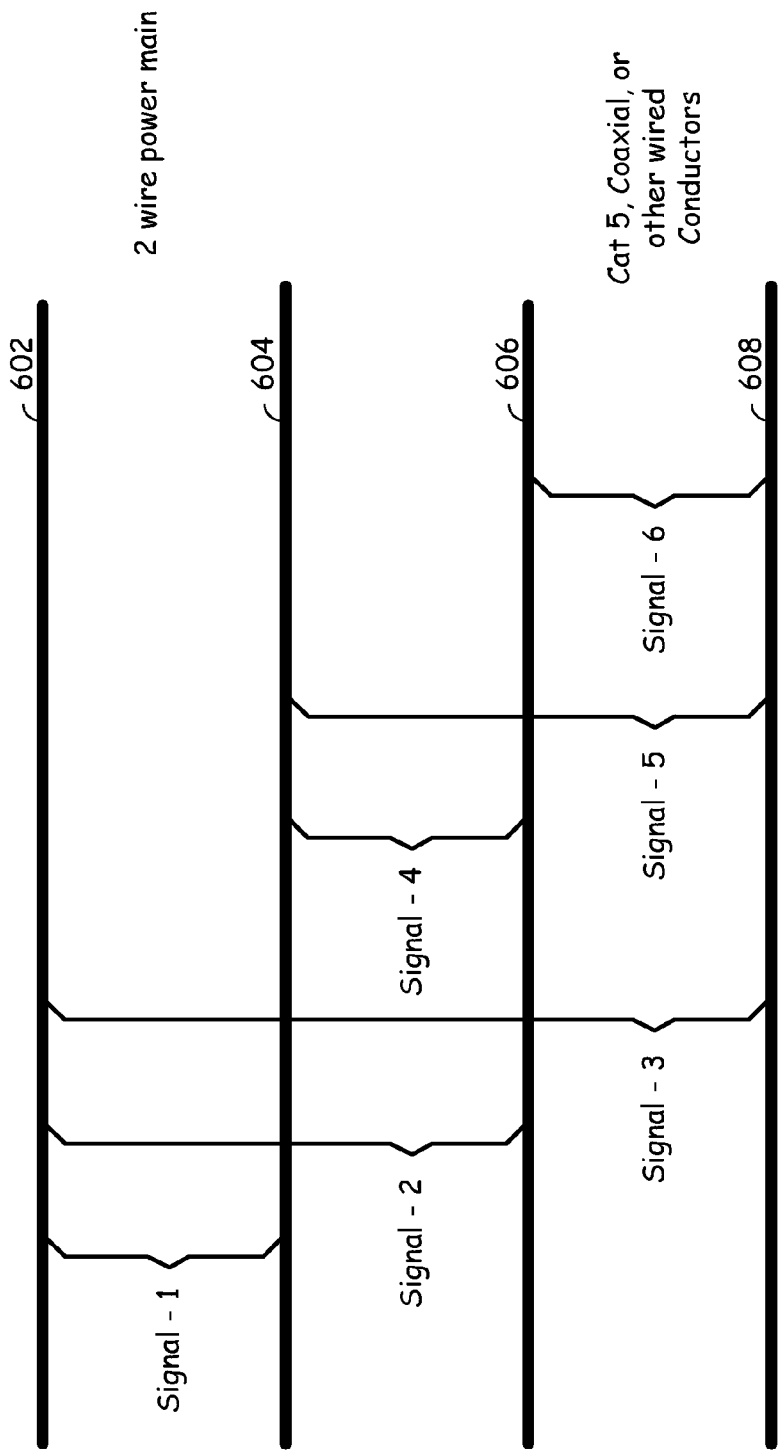
FIG. 6 is a diagram illustrating signal coupling across various conductor pairs of both a two wire power main and two other conductors, e.g., Cat-5, Coaxial, or other conductors according to one or more aspects of the present invention.

FIG. 6 is a diagram illustrating signal coupling across various conductor pairs of both a two wire power main and two other conductors, e.g., Cat-5, Coaxial, or other conductors. As illustrated in FIG. 6, the total conductors include four differing conductors 602, 604, 606, and 608. With the example of FIG. 6, conductors 602 and 604 are power mains conductors and conductors 606 and 608 are non-power mains conductors, such as Cat-5, coaxial, or other wired conductors. As is also illustrated, six differing unique signals may be coupled across unique conductor pairs of these four wires 602, 604, 606, and 608. Considering any two (or more) conductor pairs that support the at least two MIMO signals, two of the conductor pairs may share a signal return/path. Thus, according to the present invention, the MIMO signals that share a signal return path are potentially conflicting in frequency. Thus, in order to overcome such potential conflict, the MIMO signals are processed using spatial diversity techniques analogous to wireless MIMO processing to cause the differing MIMO signals to be correctly processed such that data throughput may be increased as compared to non-MIMO operations.

Figure 7:
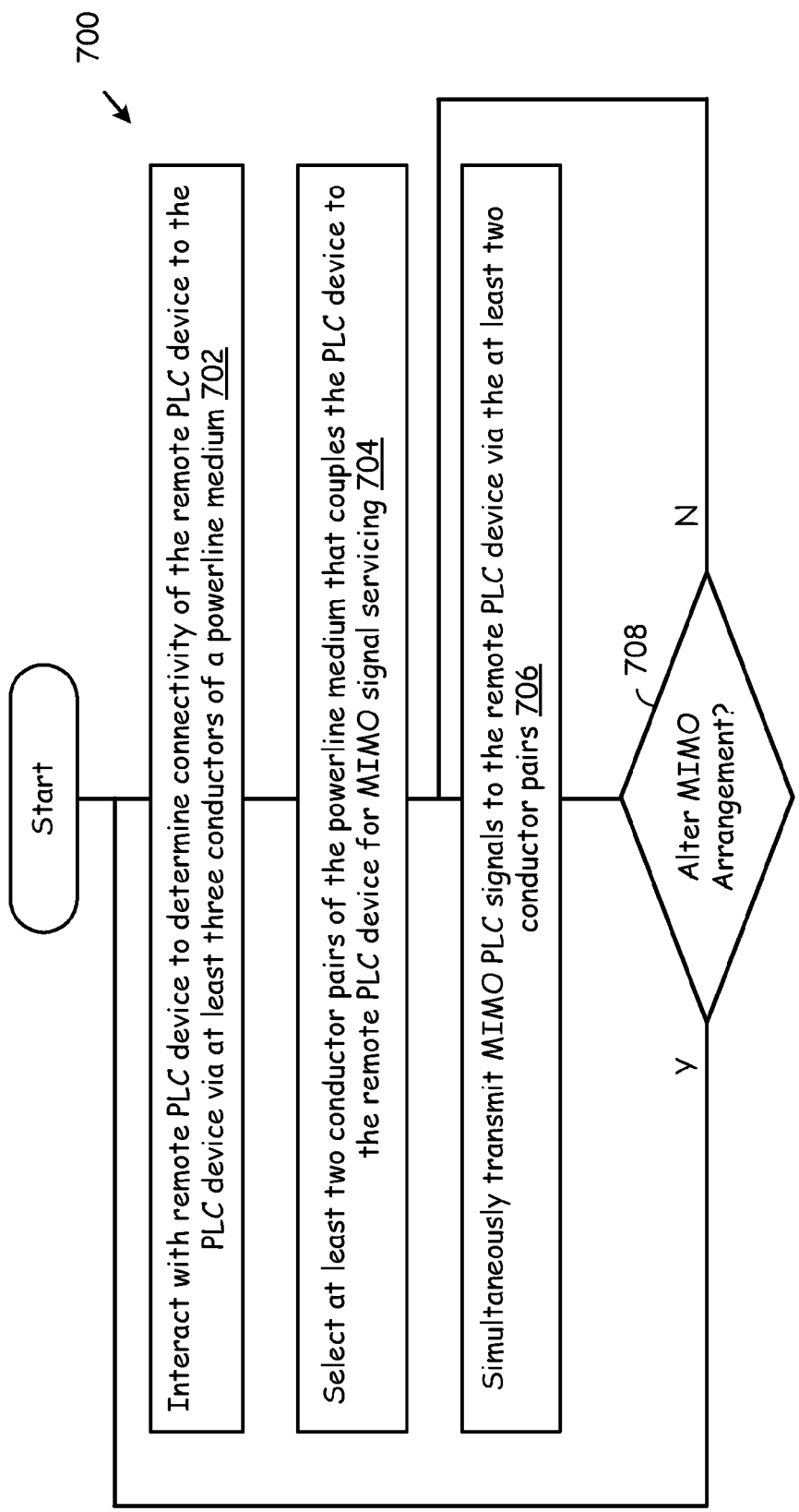
FIG. 7 is a flowchart illustrating operation of a PLC device to support Multiple-Input-Multiple-Output (MIMO) communications with a second PLC device according to one or more aspects of the present invention.

FIG. 7 is a flowchart illustrating operation of a PLC device to support Multiple-Input-Multiple-Output (MIMO) communications with a second PLC device. Operations 700 of FIG. 7 are performed by a PLC device, such as one of the PLC devices 110-124 illustrated in FIG. 1. Operations commence with the PLC device interacting with a remote PLC device to determine connectivity of the remote PLC device to the PLC device via the at least three conductors of the powerline medium (Step 702). Operations continue with the PLC device selecting at least two conductor pairs of the powerline medium that couple the PLC device to the remote PLC device for MIMO signal servicing (Step 704). Operations continue with the PLC device simultaneously transmitting MIMO PLC signals to the remote PLC device via the at least two conductor pairs (Step 706). Then, the PLC device determines whether to alter the MIMO arrangement (Step 708). If the determination is yes, operation returns to step 702. If not, operation returns to step 706.

Figure 8:
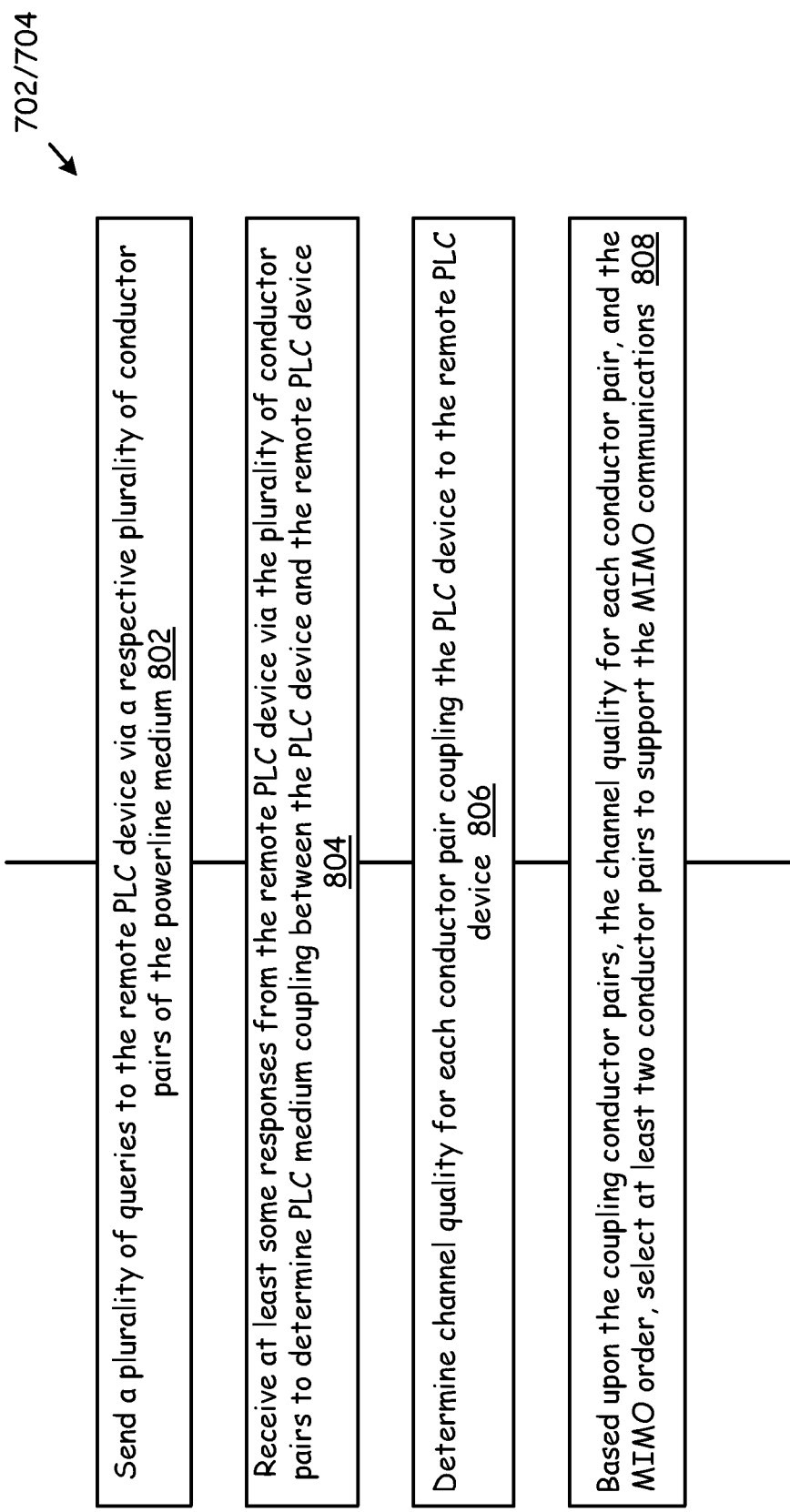
FIG. 8 is a flowchart further illustrating conductor pair selection of the operations of FIG. 7.

FIG. 8 is a flowchart further illustrating conductor pair selection of the operations of FIG. 7. Operations of Step 702/704 include the PLC device sending a plurality of queries to the remote PLC device via a respective plurality of conductor pairs of the powerline medium (Step 802). Operation then includes the PLC device receiving at least some responses from the remote PLC device via the plurality of conductor pairs to determine PLC medium coupling between the PLC device and the remote PLC device (Step 804). Operation continues with, the PLC device determining PLC channel quality available via each conductor pair coupling the PLC device to the remote PLC device via interaction with the remote PLC device (Step 806). Then, operation continues with the PLC device, based upon the coupling of conductor pairs and the channel quality for each conductor pair and the MIMO order, selecting at least two conductor pairs to support the MIMO communications (Step 808).

In determining PLC channel quality available via each conductor pair coupling the PLC device to the remote PLC device via interaction with the remote PLC device at step 806, operations may include transmitting a channel quality packet to the remote PLC device and receiving a channel quality response from the remote PLC device.

Figure 9:
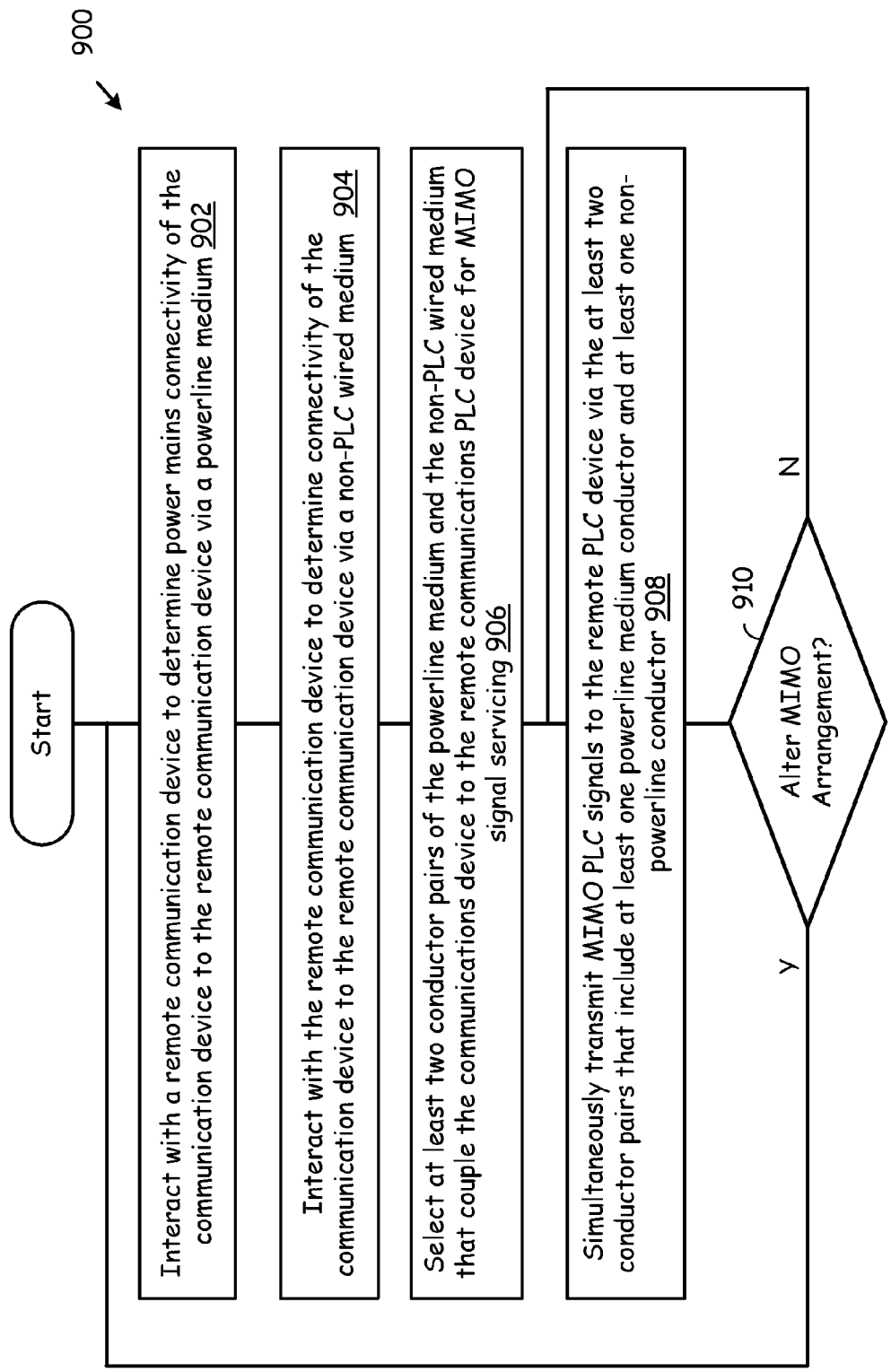
FIG. 9 is a flowchart illustrating operation of a communication device according to one or more embodiments in selecting conductors to support MIMO operations with a second device according to one or more aspects of the present invention.

FIG. 9 is a flowchart illustrating operation of a communication device according to one or more embodiments in selecting conductors to support MIMO operations with a second device. Operations 900 of FIG. 9 are performed by a communications device, which may be one of the PLC devices 110-124 illustrated in FIG. 1. Operations commence with the communications device interacting with a remote communications device to determine connectivity of the remote communications device to the communications device via a powerline medium (Step 902). Operations continue with the communications device interacting with a remote communications device to determine connectivity of the remote communications device to the communications device via non-PLC wired medium (Step 904).

Operations continue with the communications device simultaneously transmitting MIMO PLC signals to the remote communications device via the at least two conductor pairs (Step 908). Then, the communications device determines whether to alter the MIMO arrangement (Step 910). If the determination is yes, operation returns to step 902. If not, operation returns to step 908.

Figure 10:
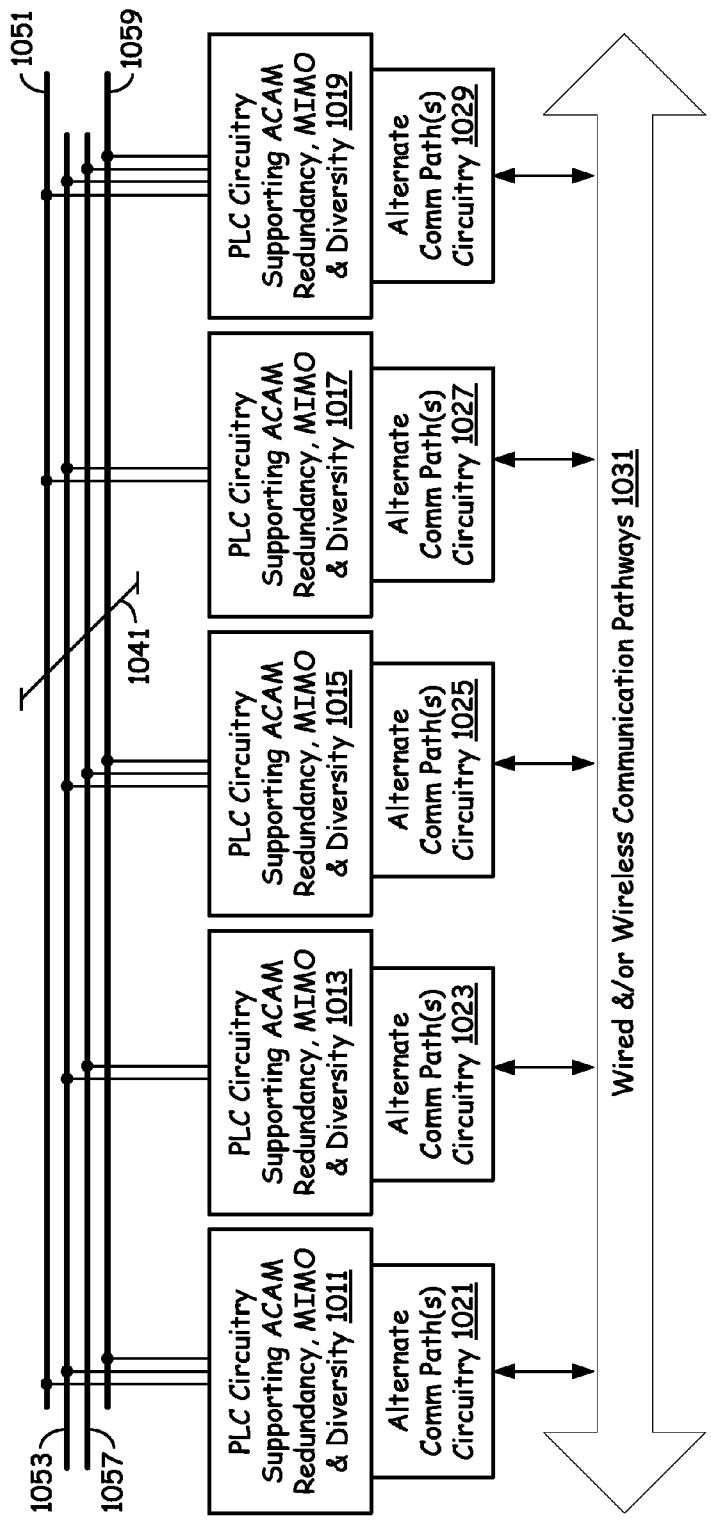
FIG. 10 is a system diagram illustrating a plurality of PLC devices constructed according to one or more embodiments of the present invention.

FIG. 10 is a system diagram illustrating a plurality of PLC devices constructed according to one or more embodiments of the present invention. A typical PLC installation may include multiple instances of PLC circuitry/PLC interfaces, which are attached in differing ways depending on their common conductor linkages such as those shown with a 4 wire power main (perhaps 3 phase plus neutral power installation). Although a 4 wire power main is shown, a fewer or greater conductor power main is contemplated.

A plurality of PLC devices couple to the power main 1041, which includes four conductors 1051, 1053, 1057, and 1059 in the embodiment of FIG. 10. Each PLC device is in a housing that includes PLC circuitry and non-PLC circuitry. Shown are five PLC devices. A first PLC device includes PLC circuitry 1011 and non-PLC circuitry 1021. Likewise, a second PLC device includes PLC circuitry 1013 and non-PLC circuitry 1023, a third PLC device includes PLC circuitry 1015 and non-PLC circuitry 1025, a fourth PLC device includes PLC circuitry 1017 and non-PLC circuitry 1027, and a fifth PLC device includes PLC circuitry 1019 and non-PLC circuitry 1029. As illustrated, all of these PLC devices may attempt to configure themselves and other PLC devices to communicate via the four conductor power mains 1041.

As shown, each PLC device may share one or more or all conductors of the power main with each other PLC device, i.e., any two PLC devices may share more than one, one, or none of the power main conductors, depending on the premises wiring and the underlying power plug connections. In addition, even though two PLC devices may share a common conductor, such common conductor may not be sufficient for use in a PLC communication path because of distance limitations.

Thus, each PLC device, via its PLC circuitry, identifies all common conductor pathways between itself and other PLC devices. In one embodiment, PLC circuitry supporting ACAM (Adaptive Conductor & Alternate Medium) redundancy, MIMO and diversity from each PLC device, i.e., PLC circuitry 1011-1019, interacts with available conductor connections provided via outlet plugs to identify each other PLC device/circuitry on a conductor by conductor basis. For example, the PLC circuitry 1011 might identify: a) conductors 1051, 1053 being shared with the PLC circuitry 1017; b) conductors 1051, 1053, 1059 being shared with the PLC circuitry 1019; c) conductor 1053 being shared with the PLC circuitry 1013; and d) conductors 1053, 1059 being shared with the PLC circuitry 1015.

If such PLC circuitry can provide PLC service via a single conductor, then the PLC circuitry 1011 may establish communication with every other PLC device. Alternatively, if two conductors are needed, the PLC circuitry 1011 will be incapable of communicating with the PLC circuitry 1013 via a PLC pathway. In addition, if the distances between the PLC devices happen to be too great and/or if signaling impairments 1041 (filter, etc.) happen to exist in a conductor pathway, such conductor will not be available for PLC pathway use between PLC devices on either side of such impairment.

For example, as shown, the PLC circuitry 1011 may only be able to establish PLC communication with the PLC circuitry 1015 due to a conductor pairing requirement and the impairment 1041, while the PLC circuitry 1015 within another PLC device might also be able to support a PLC pathway to the PLC circuitry 1013. In such circumstances, communication flow between the PLC circuitry 1011 and the PLC circuitry 1013 can be via (i) alternate communication path circuitry 1021 and 1023 (e.g., wireless communication pathways supported by the PLC devices, (ii) a routed PLC communication pathway via the PLC circuitry 1015, etc.

Assuming no impairment 1041 and distances are not too great, the PLC circuitry 1011 shares three conductor pathways to the PLC circuitry 1019. Plus, the alternate communication path circuitry 1021 and 1029 may provide yet further communication links and even further conductors (when such paths comprise wired links). With all of these available pathways and underlying conductors and conductor pairing options, configuration decisions can be made to support current and ongoing communication flow with adaptation to such configurations on the fly. For example, PLC communication between the PLC circuitry 1013 and 1015 via the conductors 1053, 1057 may cause the PLC circuitry 1011, 1019 to avoid such conductors and only utilize the conductors 1051 and 1059. As communication bandwidth demands increase between the PLC circuitry 1011 and 1019, alternate paths via the circuitry 1021, 1029 can be employed. Error rates may also cause such employment, either for redundancy or to merely offload a portion of the current PLC flow. When the communication between the PLC circuitry 1013, 1015 ends, the conductors 1053, 1057 become available. In such case, the PLC circuitry 1011, 1019 may take advantage by shifting or reallocating either or both PLC or alternate pathway flow to a PLC pathway including the conductor 1053.

No matter what the power main, spacing, impairment or other PLC or alternate communication path conditions happen to be, multiple PLC conductors, multiple alternate path conductors, and multiple independent alternate and perhaps wireless paths can be adaptively organized to manage communication flow between such PLC devices. Such organization can involve provision of multiple paths for redundancy, diversity, MIMO, duplexing, etc., performance. For example, MIMO might be established via a three conductor pair such as conductors 1051, 1053, 1059 between the PLC circuitry 1011 and 1019. As competing demands arise, MIMO may operate between conductors 1051, 1059 and two conductors (not shown) that comprise part of the wired &/or wireless communication pathways 1031 via the circuitry 1021, 1029. As competing demands rise further, MIMO might be terminated and channelized flow might be established via perhaps a wireless link within the pathways 1031 and the pair of conductors 1051, 1059. Via such channelization, portions of the overall traffic (e.g., based on QoS or upstream/downstream separation, etc.) might be split between the channels (and wherein the channels might correspond to the two separate paths).

For initial identification of conductor linkages and to manage ongoing allocations, each of the PLC circuitry 1011, 1013, 1015, 1019 might be made responsible for gaining and sharing access with other competing communication flows. Alternatively, one or more of such PLC circuitry might be assigned an overall task of arbitrating or otherwise managing conductor and alternate pathway resource allocations. For example the PLC circuitry 1019 with connection to all power line conductors, i.e., the conductors 1051-1059, might be made to send periodic beacons and arrange conductor allocations amongst all of the PLC circuitry/devices. Such allocation management may also take into consideration the available alternate communication paths, i.e., via the pathways 1031, and their loading. Such consideration might also extend to full allocation management of such alternate communication pathways as well.

To further support competing device conductor usage, PLC transmission power levels can be adjusted, e.g., reduced to minimize interference, optimize power usage, etc., to address the a current conductor or conductor pairing pathway need. In addition, any of the five PLC devices, i.e., via their PLC circuitry 1011-1019, can be active as a bridging element in a communication pathway between any other of the PLC devices. Such bridging may involve bridging from a first PLC conductor pair to a: (i) second PLC conductor pair (involving at least one different PLC conductor than those of the first PLC conductor pair); (ii) an alternate pathway conductor or pairing thereof; or (iii) an alternate wireless pathway. Such bridging may include bridging to an access point device that further couples with an Internet or intranet network.

Full or half duplex flow management may also be used to help manage flow volume and sharing of a single conductor pairing with competing traffic. Duplexing can also support split configurations such as MIMO downstream and bonded channel upstream, without MIMO. Similarly, splitting of traffic based on QoS (Quality of Service) can be used, with or without MIMO, diversity, channel bonding, etc. Channel bonding can also flow through different mediums. For example, instead of bonding between two pairings of PLC conductors, channel bonding can span one PLC conductor pairing plus an alternate communication path conductor pairing or grouping, or plus an alternate wireless communication pathway. Similarly, a communication pathway pairing might even involve one PLC conductor paired with one alternate communication pathway conductor.

Thus, although some embodiments may have rather permanent MIMO, bonding, diversity, etc., constructs, the present FIG. 10 illustrates that many other embodiments are possible wherein adaptive reorganization of PLC and alternate communication path resources can be carried out. Such adaptation can be upon installation via manual, automatic or automated configuration. Such adaptation can be thereafter changed through user input or upon detecting a network topology or device change. Further, such changes can occur on-the-fly and in real time as conditions change.

Circuitry described herein that performs particular functions may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions, which may be considered singularly or in combination a "processing module." The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry including the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the FIGs. Such a memory device or memory element can be included in an article of manufacture.

Aspects of the present invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

The invention claimed is:

1. A powerline communications (PLC) device comprising:
   a PLC interface operable to couple at least two differing communication signals to at least two differing pairs of at least three conductors of a powerline medium, including:
      at least two two-wire interfaces, each two-wire interface for servicing a respective Multiple Input Multiple Output (MIMO) PLC signal; and
      coupling circuitry for coupling MIMO signals produced by the two-wire interfaces to respective conductor pairs of the powerline medium to support at least 2×2 MIMO;
   a processing module coupled the PLC interface, the processing module and the PLC interface operable to:
      interact with a remote PLC device to determine connectivity of the remote PLC device to the PLC device via the at least three conductors of the powerline medium;
      select at least two conductor pairs of the powerline medium that communicatively couple the PLC device to the remote PLC device for MIMO signal servicing; and
      simultaneously transmit MIMO PLC signals to the remote PLC device via the at least two conductor pairs.

2. The PLC device of claim 1, wherein a conductor pair of the at least two conductor pairs shares a conductor of the powerline medium.

3. The PLC device of claim 1, wherein the processing module and the PLC interface are further operable to adapt the MIMO communication to a differing MIMO configuration based upon interaction with the remote PLC device.

4. The PLC device of claim 1, wherein MIMO communications between the PLC device and the remote PLC device are symmetrical.

5. The PLC device of claim 1, wherein the MIMO communications between the PLC device and the remote PLC device are asymmetrical.

6. A powerline communications (PLC) device comprising:
   a PLC interface operable to couple at least two differing communication signals to at least two differing pairs of at least three conductors of a powerline medium;
   a processing module coupled the PLC interface, the processing module and the PLC interface configured to:
      interact with a remote PLC device to determine connectivity of the remote PLC device to the PLC device via the at least three conductors of the powerline medium by:
         sending a plurality of queries to the remote PLC device via a respective plurality of conductor pairs of the powerline medium;
         receiving at least some responses from the remote PLC device via the plurality of conductor pairs; and
         based upon the responses, determining the connectivity of the remote PLC device to the PLC device via the at least three conductors of the powerline medium;
      select at least two conductor pairs of the powerline medium that communicatively couple the PLC device to the remote PLC device for Multiple Input Multiple Output (MIMO) signal servicing; and
      simultaneously transmit MIMO PLC signals to the remote PLC device via the at least two conductor pairs.

7. The PLC device of claim 6, further comprising the processing module and PLC interface operable to:
   determine PLC channel quality available via each conductor pair coupling the PLC device to the remote PLC device via interaction with the remote PLC device; and
   based upon the PLC channel quality, select the at least two conductor pairs.

8. The PLC device of claim 7, wherein in determining PLC channel quality available via each conductor pair coupling the PLC device to the remote PLC device via interaction with the remote PLC device, the processing module and PLC interface are operable to, for each conductor pair coupling the PLC device to the remote PLC device:
   transmit a channel quality packet to the remote PLC device; and
   receive a channel quality response from the remote PLC device.

9. A method for operating a first PLC (Power Line Communications) device to support communication with a second PLC device via a plurality of powerline medium conductors, the method comprising:
   identifying a number of available conductors from the plurality of powerline medium conductors, the available conductors being those of the plurality of powerline medium conductors that are attached to both the first PLC device and the second PLC device;
   determining PLC channel quality available via each conductor pair coupling the first PLC device to the second PLC device via interaction with the second PLC device;
   based upon the PLC channel quality, selecting at least two conductor pairs; and
   establishing Multiple Input Multiple Output (MIMO) communications via the at least two conductor pairs if the number of available conductors is sufficient to support MIMO.

10. The method of claim 9, wherein the MIMO communication comprises at least 2×2 MIMO.

11. The method of claim 9, further comprising adapting the MIMO communication to a differing MIMO configuration based upon interaction between the first and second PLC devices.

12. The method of claim 9, wherein in determining PLC channel quality available via each conductor pair coupling the first PLC device to the second PLC device via interaction with the remote PLC device comprises:
- transmitting a packet to the second PLC device; and
- receiving a response from the second PLC device.

13. A method for operating a first PLC (Power Line Communications) device to support communication with a second PLC device via a plurality of powerline medium conductors, the method comprising:
- identifying a number of available conductors from the plurality of powerline medium conductors, the available conductors being those of the plurality of powerline medium conductors that are attached to both the first PLC device and the second PLC device;
- arranging the number of available conductors into conductor pairings; and
- establishing Multiple Input Multiple Output (MIMO) communications if the number of available conductors is sufficient to support MIMO.

14. The method of claim 13, wherein the MIMO communication comprises at least 2×2 MIMO.

15. The method of claim 13, further comprising adapting the MIMO communication to a differing MIMO configuration based upon interaction between the first and second PLC devices.

16. A communications device that communicates via a coupled powerline medium, the communication device comprising:
- a PLC (Power Line Communication) interface operable to couple a communication signal to at least a first conductor of the coupled powerline medium;
- a non-PLC communication interface operable to support non-PLC communication; and
- a processing module coupled the PLC interface and to the non-PLC communication interface, the processing module, the PLC interface, and the non-PLC communication interface operable to:
  - interact with a remote communications device to determine connectivity of the remote communications device to the communications device via the powerline medium and the non-PLC communication interface;
  - establish a Multiple Input Multiple Output (MIMO) configuration based at least in part on the connectivity determination such that a first portion of a MIMO communication is supported by the PLC interface and a second portion of the MIMO communication is supported by the non-PLC communication interface.

17. The communications device of claim 16, wherein the MIMO configuration comprises a first conductor pair from the powerline medium and a second conductor pair accessed via the non-PLC communication interface.

18. The communications device of claim 16, wherein the MIMO configuration comprises a first conductor from the powerline medium and a second conductor accessible via the non-PLC communication interface.

19. The communications device of claim 16, wherein the MIMO configuration adapts as a communication characteristics change.

20. The communications device of claim 16, wherein the MIMO configuration comprises at least 2×2 MIMO.

* * * * *

UNITED STATES PATENT AND TRADEMARK OFFICE
CERTIFICATE OF CORRECTION

| | | |
|---|---|---|
| PATENT NO. | : 8,750,392 B2 | Page 1 of 1 |
| APPLICATION NO. | : 13/434908 | |
| DATED | : June 10, 2014 | |
| INVENTOR(S) | : Jeyhan Karaoguz et al. | |

It is certified that error appears in the above-identified patent and that said Letters Patent is hereby corrected as shown below:

In the Claims

Col. 12, line 5, in claim 6: after "a processing module coupled" insert --to--
Col. 14, line 3, in claim 16: after "a processing module coupled" insert --to--

Signed and Sealed this
Fifth Day of May, 2015

Michelle K. Lee
*Director of the United States Patent and Trademark Office*